(12) United States Patent
Lee

(10) Patent No.: US 8,089,082 B2
(45) Date of Patent: Jan. 3, 2012

(54) NITRIDE SEMICONDUCTOR LED AND FABRICATION METHOD THEREOF

(75) Inventor: Suk Hun Lee, Gwangju (KR)

(73) Assignee: LG Innotek Co., Ltd., Seoul (KR)

(*) Notice: Subject to any disclaimer, the term of this patent is extended or adjusted under 35 U.S.C. 154(b) by 0 days.

(21) Appl. No.: 12/917,082

(22) Filed: Nov. 1, 2010

(65) Prior Publication Data

US 2011/0042645 A1 Feb. 24, 2011

Related U.S. Application Data

(63) Continuation of application No. 11/718,664, filed as application No. PCT/KR2005/002173 on Jul. 6, 2005, now Pat. No. 7,847,279.

(51) Int. Cl.
*H01L 33/04* (2010.01)
*H01L 33/32* (2010.01)
*H01L 33/00* (2010.01)

(52) U.S. Cl. ............... 257/96; 257/95; 257/97

(58) Field of Classification Search ............ 257/95, 257/96, 97, E33.027, E33.008, E33.001
See application file for complete search history.

(56) References Cited

U.S. PATENT DOCUMENTS

| | | | | |
|---|---|---|---|---|
| 4,316,156 A | * | 2/1982 | Scifres et al. | 372/50.1 |
| 4,450,567 A | * | 5/1984 | Scifres et al. | 372/50.1 |
| 4,555,785 A | * | 11/1985 | Scifres et al. | 372/8 |
| 5,031,012 A | * | 7/1991 | Cunningham et al. | 257/80 |
| 5,136,353 A | * | 8/1992 | Pankove et al. | 250/214 SW |
| 5,404,373 A | * | 4/1995 | Cheng | 372/50.124 |
| 5,546,496 A | * | 8/1996 | Kimoto et al. | 385/146 |
| 5,550,391 A | * | 8/1996 | Yamaguchi | 257/96 |
| 5,650,641 A | | 7/1997 | Sassa et al. | |
| 5,665,986 A | | 9/1997 | Miura et al. | |
| 5,739,552 A | | 4/1998 | Kimura et al. | |
| 5,886,367 A | | 3/1999 | Udagawa | |
| 6,091,085 A | | 7/2000 | Lester | |
| 6,144,683 A | * | 11/2000 | Floyd | 372/50.12 |
| 6,172,382 B1 | | 1/2001 | Nagahama et al. | |
| 6,266,355 B1 | | 7/2001 | Sverdlov | |
| 6,320,209 B1 | | 11/2001 | Hata et al. | |

(Continued)

FOREIGN PATENT DOCUMENTS

JP 10-178203 6/1998

(Continued)

OTHER PUBLICATIONS

Office Action dated May 10, 2011 in Japanese Application No. 2008-519153, filed Jul. 6, 2007.

*Primary Examiner* — Long Tran
*Assistant Examiner* — Jordan Klein
(74) *Attorney, Agent, or Firm* — Saliwanchik, Lloyd & Eisenschenk

(57) ABSTRACT

A nitride semiconductor light emitting diode according to the present invention, includes: a substrate; a buffer layer formed on the substrate; an In-doped GaN layer formed on the buffer layer; a first electrode layer formed on the In-doped GaN layer; an $In_xGa_{1-x}N$ layer formed on the first electrode layer; an active layer formed on the $In_xGa_{1-x}N$ layer; a first P—GaN layer formed on the active layer; a second electrode layer formed on the first P—GaN layer; a second P—GaN layer partially protruded on the second electrode layer; and a third electrode formed on the second P—GaN layer.

16 Claims, 4 Drawing Sheets

U.S. PATENT DOCUMENTS

| | | | |
|---|---|---|---|
| 6,388,275 B1 | 5/2002 | Kano | |
| 6,541,797 B1 | 4/2003 | Udagawa | |
| 6,657,236 B1 * | 12/2003 | Thibeault et al. | 257/98 |
| 6,791,117 B2 * | 9/2004 | Yoshitake et al. | 257/94 |
| 6,825,500 B1 * | 11/2004 | Komaba | 257/96 |
| 6,849,864 B2 * | 2/2005 | Nagahama et al. | 257/22 |
| 6,936,860 B2 | 8/2005 | Sung et al. | |
| 6,958,497 B2 | 10/2005 | Emerson et al. | |
| 7,009,221 B2 * | 3/2006 | Ohno | 257/107 |
| 7,122,734 B2 | 10/2006 | Fetzer et al. | |
| 7,129,515 B2 | 10/2006 | Okuyama et al. | |
| 7,154,125 B2 * | 12/2006 | Koide et al. | 257/95 |
| 7,402,838 B2 | 7/2008 | Tanizawa et al. | |
| 7,675,075 B2 * | 3/2010 | Nagai | 257/90 |
| 2002/0096687 A1 | 7/2002 | Kuo et al. | |
| 2003/0218179 A1 | 11/2003 | Koide et al. | |
| 2004/0227151 A1 * | 11/2004 | Konno et al. | 257/103 |
| 2006/0081831 A1 | 4/2006 | Lee | |

FOREIGN PATENT DOCUMENTS

| | | |
|---|---|---|
| JP | 11-274568 A | 10/1999 |
| JP | 11-340509 A | 12/1999 |
| JP | 2003-060236 A | 2/2003 |
| KR | 2002-0079659 A | 10/2002 |
| WO | WO-2005/038937 A1 | 4/2005 |

* cited by examiner

NITRIDE SEMICONDUCTOR LED AND FABRICATION METHOD THEREOF

CROSS REFERENCE TO RELATED APPLICATIONS

This application is a continuation of U.S. application Ser. No. 11/718,664, filed May 4, 2007, which is the U.S. national stage application of International Patent Application No. PCT/KR2005/002173, filed Jul. 6, 2005, which are incorporated herein by reference in their entirety.

TECHNICAL FIELD

The present invention relates to a nitride semiconductor light emitting diode (LED) and a fabrication method thereof.

BACKGROUND ART

In general, a GaN-based nitride semiconductor is being applied to an optical device of a blue/green Light Emitting Diode (LED), and an electronic device being a high-speed switching and high power device such as MESFET and HEMT. Specifically, the blue/green LED is under mass production, and its global sale is being exponentially increased.

Such a GaN-based nitride semiconductor light emitting diode is mainly grown on a sapphire substrate or a SiC substrate. Next, a thin film of polycrystalline $Al_yGa_{1-y}N$ is grown as a buffer layer on the sapphire substrate or the SiC substrate at a low growth temperature. After that, an undoped GaN layer, a silicon (Si)-doped N—GaN layer, or an N—GaN layer having a combined structure thereof is formed on the buffer layer at a high temperature. A magnesium (Mg)-doped P—GaN layer is formed on the GaN layer to complete the nitride semiconductor light emitting diode. A light emitting layer (multi quantum well structured active layer) is sandwiched between the N—GaN layer and the P—GaN layer.

The P—GaN layer is formed by doping an atom of magnesium (Mg) in the growth of its crystal. The doped Mg atom should be substituted by gallium (Ga), thereby enabling the GaN layer to serve as a P—GaN layer, but is combined with a hydrogen gas released from a carrier gas and a source, to form a composition of Mg—H in a GaN crystalline layer and become material having a high resistance of 10 MΩ or so.

Accordingly, a subsequent activation process is required for disconnecting the composition of Mg—H and substituting the Mg atom with gallium (Ga) after the forming of a PN junction light emitting diode. However, the light emitting diode has a disadvantage in that an amount of carriers contributing to light emission in the activation process is $10^{17}/cm^3$ or so, which is very lower than a Mg atomic concentration of more than $10^{19}/cm^3$, thereby making it so difficult to form a resistant contact.

In order to improve this, a method for reducing a contact resistance using a very thin transmission resistant metallic material, thereby increasing an efficiency of current injection. However, the thin transmission resistant metal used to reduce the contact resistance generally has a light transmission of 75 to 80 percentages or so, and its remainder acts as a loss. Further, there is a limitation in improving the light output in the crystal growth itself of the nitride semiconductor, without improving a design of the light emitting diode and a crystallinity of the light emitting layer and the P—GaN layer, in order to increase an internal quantum efficiency.

Further, in the above structured light emitting diode, when a bias voltage is applied to the N—GaN layer and the P—GaN layer, electrons and holes are injected into N-type and P-type nitride semiconductor layers, and are recombined in the light emitting layer, thereby emitting light. Here, there is a drawback in that the light emitted from the light emitting diode is again partially reverse reflected inside at a boundary of the P—GaN layer and the contact layer, thereby decreasing the light output.

DETAILED DISCLOSURE

Technical Problem

An object of the present invention is to provide a nitride semiconductor light emitting diode having an active layer improved in crystallinity, light output, and reliability, and a fabrication method thereof.

Technical Solution

To achieve these and other advantages and in accordance with the purpose of the present invention, as embodied and broadly described, there is provided a nitride semiconductor light emitting diode, including: a substrate; a buffer layer formed on the substrate; an In-doped GaN layer formed on the buffer layer; a first electrode layer formed on the In-doped GaN layer; an $In_xGa_{1-x}N$ layer formed on the first electrode layer; an active layer formed on the $In_xGa_{1-x}N$ layer; a first P—GaN layer formed on the active layer; a second electrode layer formed on the first P—GaN layer; a second P—GaN layer partially protruded on the second electrode layer; and a third electrode layer formed on the second P—GaN layer.

The second and third electrode layers are formed using a super grading $In_xGa_{1-x}N$ layer whose indium content is sequentially fluctuated, an InGaN/InGaN super lattice structure layer, or an InGaN/AlInGaN super lattice structure.

The second electrode layer and/or the third electrode layer additionally has a transparent electrode applied bias voltage.

The transparent electrode is formed of transmission metal oxide or transmission resistant metal, and is selected from Indium-Tin-Oxide (ITO), Zinc Oxide (ZnO), iridium oxide (IrOx), ruthenium oxide (RuOx), nickel oxide (NiO) and aurum (Au) alloy containing nickel (Ni).

In another aspect of the present invention, there is provided a nitride semiconductor light emitting diode, including: a substrate; a buffer layer formed on the substrate; an In-doped GaN layer formed on the buffer layer; a first electrode layer formed on the In-doped GaN layer; a first $In_xGa_{1-x}N$ layer formed on the first electrode layer; an active layer formed on the first $In_xGa_{1-x}N$ layer; a P—GaN layer formed on the active layer; and a super grading second N—$In_xGa_{1-x}N$ layer having an indium content sequentially fluctuated, and formed on the first P—GaN layer.

In a further another aspect of the present invention, there is provided nitride semiconductor light emitting diode, including: a substrate; a buffer layer formed on the substrate; an In-doped GaN layer formed on the buffer layer; a first electrode layer formed on the In-doped GaN layer; an $In_xGa_{1-x}N$ layer formed on the first electrode layer; an active layer formed on the $In_xGa_{1-x}N$ layer; a P—GaN layer formed on the active layer; and an InGaN/AlInGaN super lattice structure layer formed on the P—GaN layer.

In a still further aspect of the present invention, there is provided a method for fabricating a nitride semiconductor light emitting diode, the method including: forming a buffer layer on a substrate; forming an In-doped GaN layer on the buffer layer; forming a first electrode layer on the In-doped GaN layer; forming a first $In_xGa_{1-x}N$ layer on the first electrode layer; forming an active layer on the first $In_xGa_{1-x}N$ layer; forming a first P—GaN layer on the active layer; forming a second electrode layer on the first P—GaN layer; and forming partially protruded second P—GaN layer and third electrode layer on the second electrode layer.

Advantageous Effects

According to the present invention, there is an advantage in that an active layer of a nitride semiconductor light emitting diode can be improved in crystallinity, light output, and reliability.

MODE FOR INVENTION

Hereinafter, preferred embodiments of the present invention will be described in detail with reference to accompanying drawings.

Figure 1:
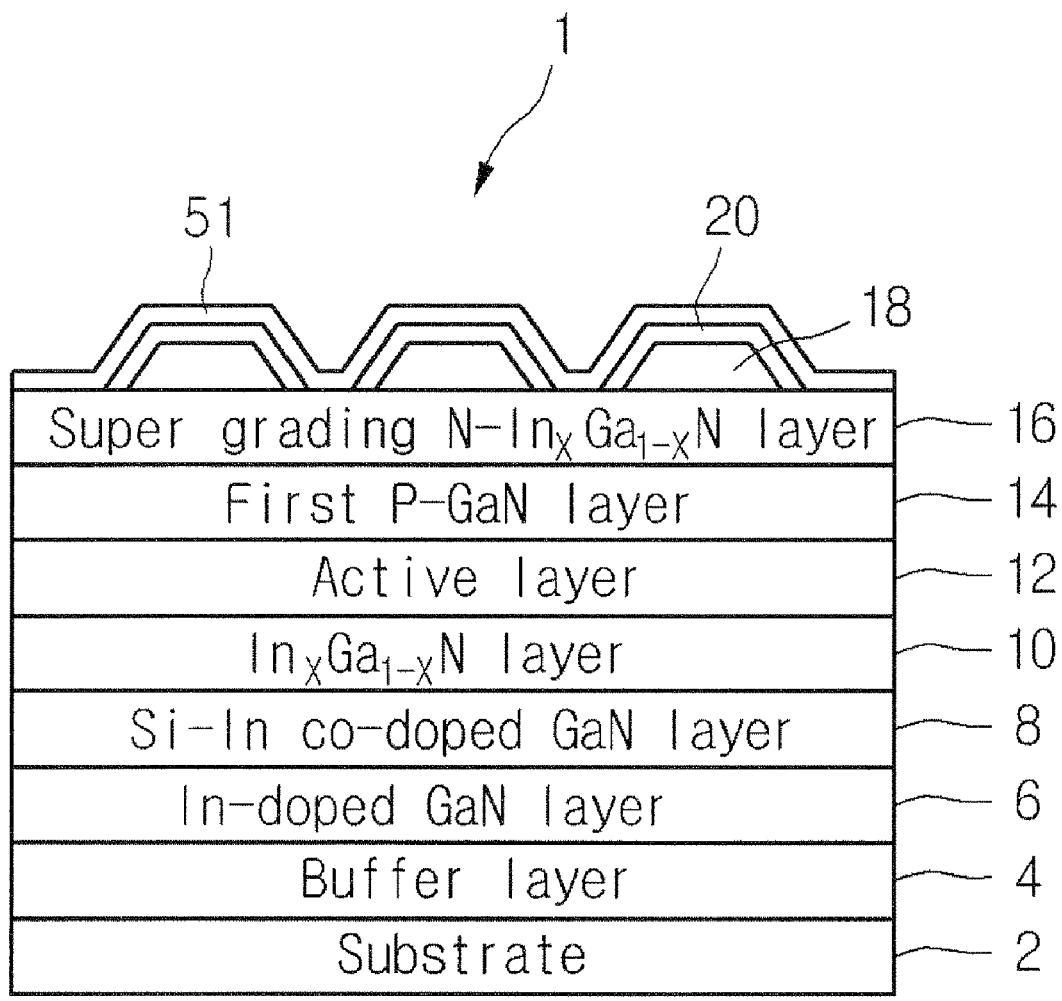
FIG. 1 schematically illustrates a layered structure of a nitride semiconductor light emitting diode according to the first embodiment of the present invention.

FIG. 1 schematically illustrates a layered structure of a nitride semiconductor light emitting diode according to the first embodiment of the present invention.

In the inventive nitride semiconductor light emitting diode 1, a buffer layer 4 is formed on a substrate 2 as shown in FIG. 1. The buffer layer 4 can be formed to have any one of an AlInN/GaN layered structure, an $In_xGa_{1-x}N$/GaN layered structure, and an $Al_xIn_yGa_{1-(x+y)}N$/$In_xGa_{1-x}N$/GaN layered structure.

An In-doped GaN layer 6 is formed on the buffer layer 4, and an N-type first electrode layer is formed on the In-doped GaN layer 6. The N-type first electrode layer can employ a Si—In co-doped GaN layer 8 having silicon (Si) and indium (In) concurrently doped therein.

Further, a low-mole first $In_xGa_{1-x}N$ layer 10 having a low content of indium is formed on the Si—In co-doped GaN layer 8, and an active layer 12 emitting light is formed on the first $In_xGa_{1-x}N$ layer 10. The active layer 12 can be provided in a single quantum well structure or a multi quantum well structure having InGaN well layer/InGaN barrier layer. Its layered structure will be later described with reference to FIG. 3 in more detail.

After that, the first P—GaN layer 14 is formed on the active layer 12. The first P—GaN layer 14 can have magnesium doped therein.

An N-type second electrode layer is formed on the first P—GaN layer 14. The N-type second electrode layer can employ a super grading N—$In_xGa_{1-x}N$ layer 16 whose energy band gap is controlled by sequentially varying an indium composition. The super grading N—$In_xGa_{1-x}N$ layer 16 can be formed to have a composition range (x) of 0 to 0.2.

Considering that the first electrode layer 8 and the second electrode layer 16 are all formed of N-type nitride, and have the first P—GaN layer 14 interposed therebetween, the inventive nitride semiconductor light emitting diode can be analyzed to have a structure of an NPN junction light emitting diode unlike a related art PN junction light emitting diode.

A second P—GaN layer 18 is partially formed on the super grading N—$In_xGa_{1-x}N$ layer 16 to have a protrusive convex shape, and an N—$In_xGa_{1-x}N$ layer 20 being a third electrode layer is formed on the second P—GaN layer 18. The second P—GaN layer 18 and the third electrode layer 20 have the same or similar structure with the first P—GaN layer 14 and the second electrode layer, and can be formed through the following fabrication process.

In other words, first, an insulating film is partially formed on the super grading N—$In_xGa_{1-x}N$ layer 16 to partially expose the super grading N—$In_xGa_{1-x}N$ layer 16. After that, the second P—GaN layer 18 and the N—$In_xGa_{1-x}N$ layer 20 are formed on the exposed super grading N—$In_xGa_{1-x}N$ layer 16. Next, the insulating film is removed.

At this time, masking is selectively performed using the insulating film in various types, and the N/P nitride semiconductors 20 and 18 can be again grown-up on the second electrode layer 16 to have various types of size, shape and depth. According to the present invention, an external quantum efficiency can be improved by selectively removing a portion masked with the insulating film and forming an indented portion (convex portion) on a surface of the light emitting diode.

In the related art PN junction light emitting diode, its surface was partially etched and indent-shaped (convex-shaped). Such an etching technique has a disadvantage in that a damage of a P—GaN surface is caused, and accordingly a contact resistance is increased, thereby reducing a current injection effect and reducing a light output. Further, it has a disadvantage in that when a high current is applied, a high contact resistance causes the generation of heat, thereby causing a serious influence on a reliability of device.

Further, the N-type nitride semiconductors (for example, the super grading N—$In_xGa_{1-x}N$ layers 16 and 20) used as the second and third electrode layers have a lower resistance than a related art P—GaN contact layer and accordingly, its contact resistance can be reduced, thereby maximizing the injection of current. Further, the second and third electrode layers can employ all of a light transmission electrode and a light non-transmission electrode as electrodes for applying a bias voltage. The light transmission electrode 51 can employ a transmission resistant metal layer or a transmission metal-oxide layer with the maximization of current spreading and an excellent light transmission so as to maximize the light output. Such material can employ Indium-Tin-Oxide (ITO), Zinc Oxide (ZnO), ruthenium oxide (RuOx), iridium oxide (IrOx), and nickel oxide (NiO) or an aurum (Au) alloy metal containing nickel (Ni). The electrode 51 can be formed on the second electrode layer 16 and the third electrode layer 20.

Figure 2:
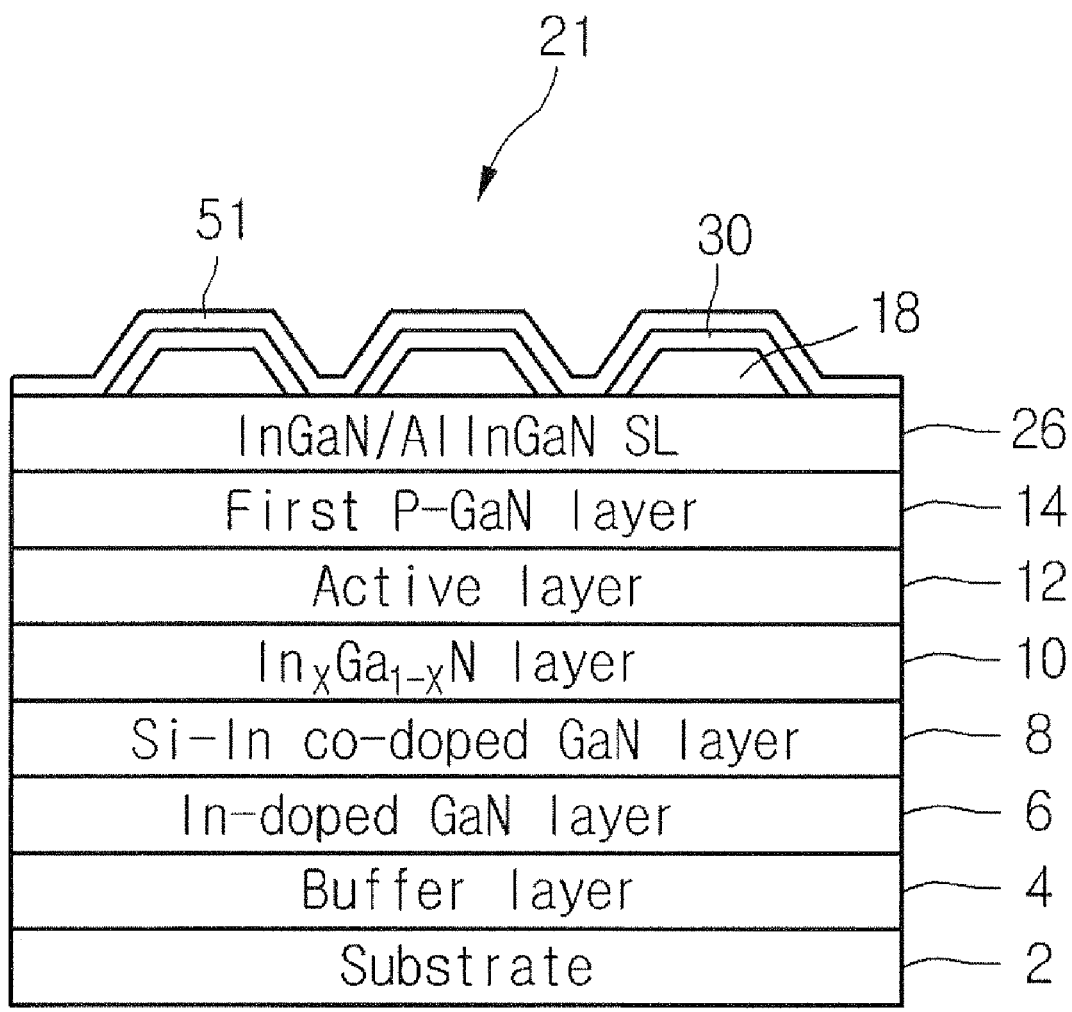
FIG. 2 schematically illustrates a layered structure of a nitride semiconductor light emitting diode according to the second embodiment of the present invention.

FIG. 2 schematically illustrates a layered structure of a nitride semiconductor light emitting diode according to the second embodiment of the present invention.

In the inventive layered structure of the nitride semiconductor light emitting diode 21, only second and third electrode layers are different from those of the nitride semiconductor light emitting diode 1. Accordingly, only the second and third electrode layers will be described below.

In other words, in the inventive nitride semiconductor light emitting diode 21, first and second InGaN/AlInGaN super lattice structure layers 26 and 30 are formed as the second and third electrode layers. The first and second InGaN/AlInGaN super lattice structure layers 26 and 30 can also have silicon doped therein.

By forming the above layered structure, an N/P/N light emitting diode can be realized. The N/P/N light emitting diode is selectively masked on its surface, using an insulating film, only a N/P nitride semiconductor is again grown up, and then the selectively masking insulating film is removed, thereby completing the light emitting diode having a convex (indented) shape.

Though not illustrated in the drawings, first and second InGaN/InGaN super lattice structures can be also formed as the second and third electrode layers, and also can have silicon doped therein.

Figure 3:
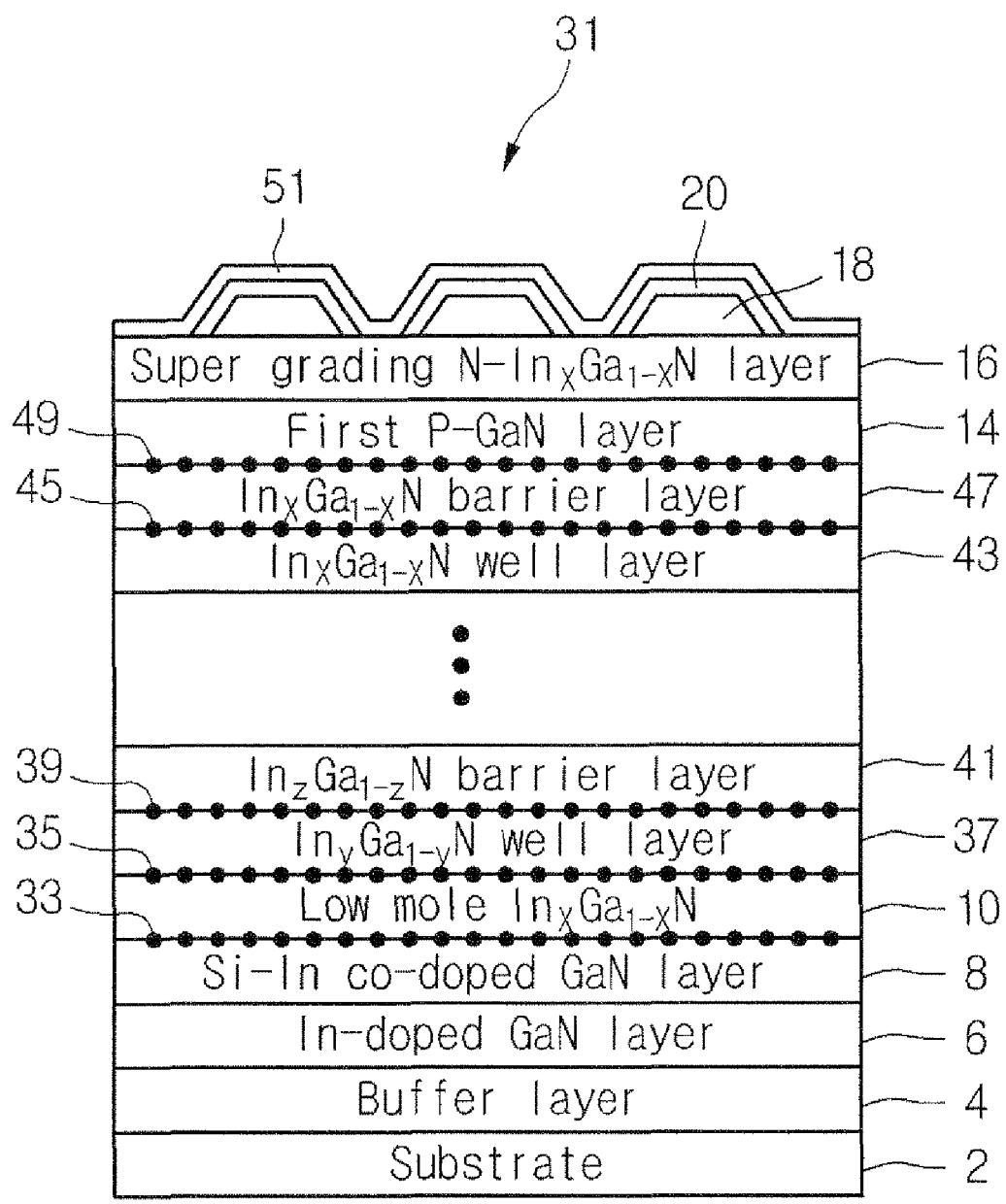
FIG. 3 schematically illustrates a layered structure of a nitride semiconductor light emitting diode according to the third embodiment of the present invention.

Thus, a structure of an active layer adopted in a nitride semiconductor light emitting diode 31 according to the present invention will be in more detail described with reference to FIG. 3. FIG. 3 schematically illustrates a layered structure of the nitride semiconductor light emitting diode according to the third embodiment of the present invention. In the layered structure of FIG. 3, a description of the layer (denoted by the same reference numeral) of FIG. 1 will be omitted.

As shown in FIG. 3, the inventive nitride semiconductor light emitting diode 31 has a low-mole $In_xGa_{1-x}N$ layer 10 having a low content of indium for controlling a strain of the active layer, so as to increase an internal quantum efficiency. Further, the inventive nitride semiconductor light emitting diode 31 further includes a first $SiN_x$ cluster layer 33 and a second $SiN_x$ cluster layer 35, which are controlled in an atomic scale, below and on the low-mole $In_xGa_{1-x}N$ layer 10 so as to improve a reverse leakage current and the light output resulting from the fluctuation of indium.

Further, the active layer emitting the light can be formed to have a single quantum well structure or a multi quantum well structure constituted of $In_yGa_{1-y}N$ well layer/$In_zGa_{1-z}N$ barrier layer.

FIG. 3 shows an example of the light emitting diode having the multi quantum well structure further including $SiN_x$ cluster layers 39 and 45, which are respectively interposed between $In_yGa_{1-y}N$ well layers 37 and 43 and $In_zGa_{1-z}N$ barrier layers 41 and 47. Here, the $In_yGa_{1-y}N$ well layer/SiNx cluster layer/$In_zGa_{1-z}N$ barrier layer can be also controlled to have a composition ratio of $0<y<0.35$ and $0<z<0.1$, in order to improve an efficiency of light emission of the active layer. Considering a relation with the low-mole $In_xGa_{1-x}N$ layer 10 having the low content of indium, the content of indium doped into the $In_yGa_{1-y}N$ well layers 37 and 43/$In_zGa_{1-z}N$ barrier layers 41 and 47, and the content of indium doped into the low-mole $In_xGa_{1-x}N$ layer 10 can be controlled to have values of $0<x<0.1$, $0<y<0.35$, and $0<z<0.1$.

Figure 4:
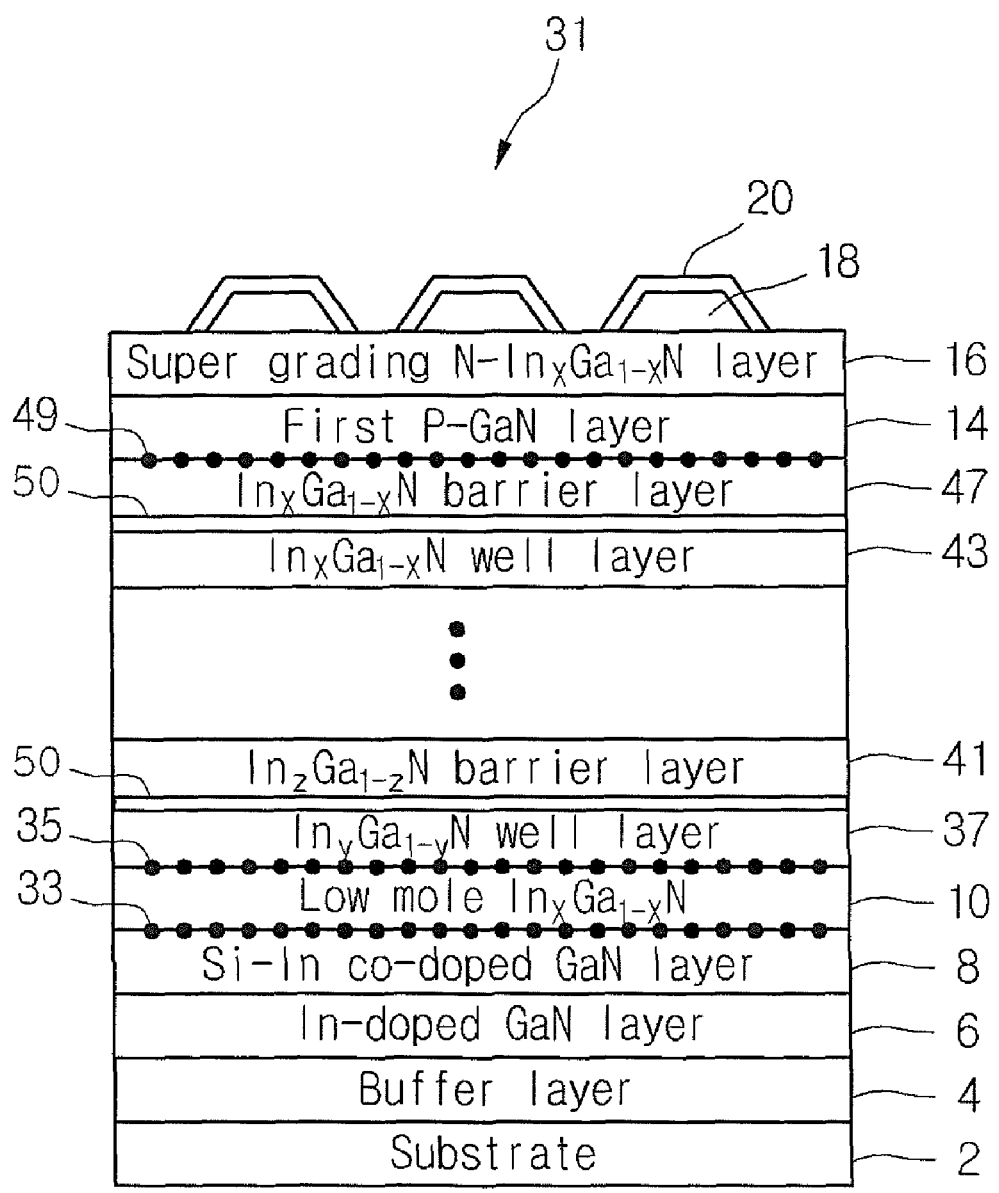
FIG. 4 schematically illustrates a layered structure of a nitride semiconductor light emitting diode according to another embodiment of the third embodiment of the present invention.

As shown in FIG. 4, a GaN cap layer 50 for controlling an amount of indium fluctuation of the $In_yGa_{1-y}N$ well layer 37 and 43 can be also formed between the $In_yGa_{1-y}N$ well layer 37 and 43 and the $In_zGa_{1-z}N$ barrier layer 41 and 47 constituting the active layer. Here, the well layer 37 and 43 and the barrier layer 41 and 47 emitting the light can respectively have the indium contents to provide a configuration of $In_yGa_{1-y}N$ ($0<y<0.35$)/GaN cap/$In_zGa_{1-z}N$ ($0<z<0.1$).

After the last layer of the active layer having the single quantum well layer or the multi quantum well structure is grown-up, and then the $SiN_x$ layer 49 is again grown-up at a thickness of atomic scale, thereby suppressing a diffusion of magnesium (Mg) of the first P—GaN layer 14 into the active layer.

FIG. 3 illustrates a case where the second electrode layer employs the super grading N—$In_xGa_{1-x}N$ layer 16, but the second electrode layer can also employ the InGaN/AlInGaN super lattice structure layer or the InGaN/InGaN super lattice structure layer.

Though not illustrated in the above embodiments (FIGS. 1 to 3), an electrode (or an electrode pad) of the first electrode layer is formed on the first electrode layer after a partial etching up to the first electrode layer of the nitride semiconductor, and an electrode pad can be additionally formed on the transparent electrode 51 formed on the second or third electrode layer.

As described above, in the inventive nitride semiconductor light emitting diode, the N/P/N junction light emitting diode structure can be applied to reduce an operation voltage while to improve current injection, thereby improving a phenomenon of current concentration resulting from the high contact resistance of the P—GaN layer itself used as the P-type electrode layer in the related art P/N junction light emitting diode. Further, only the N/P junction layer is selectively again grown up using the insulating film, and the indention portion (convex portion) is formed on the surface of the light emitting diode, thereby increasing the external quantum efficiency.

The inventive nitride semiconductor light emitting diode is an (N/P)/N/P/N junction light emitting diode for reducing a surface damage occurring in the partial etching of the related art P—GaN surface and its operation voltage, increasing the external quantum efficiency of the light emitting diode, providing an excellent crystallinity through re-growth, and fundamentally improving the internal quantum efficiency.

Further, the inventive nitride semiconductor light emitting diode has a structure having the first electrode layer and the second electrode layer formed of an N-type nitride semiconductor, and specifically improving the contact resistance of the second electrode layer, thereby improving the light output.

INDUSTRIAL APPLICABILITY

In a nitride semiconductor light emitting device and a fabrication method thereof according to the present invention, the active layer constituting the nitride semiconductor light emitting diode is improved in crystallinity, light output, and reliability.

What is claimed is:
1. A light emitting diode, comprising:
a first conductive semiconductor layer;
an active layer on the first conductive semiconductor layer;
a second conductive semiconductor layer on the active layer;
a third conductive semiconductor layer on the second conductive semiconductor layer;
a fourth semiconductor layer on the third conductive semiconductor layer, and
a fifth semiconductor layer formed on a surface of the fourth semiconductor layer,
wherein the fourth semiconductor layer comprises portions partially protruded from the third conductive semiconductor layer and the portions are spaced apart from each other,
wherein the fourth semiconductor layer includes a dopant of an opposite polarity from a polarity of the first conductive semiconductor layer,
wherein the first conductive semiconductor layer, the third conductive semiconductor layer and the fifth semiconductor layer comprise an n-type semiconductor layer,
wherein the second conductive semiconductor layer and the fourth semiconductor layer comprise a p-type semiconductor layer.

2. The light emitting diode according to claim 1, wherein a width of a top surface of the fourth semiconductor layer is smaller than a width of lower surface of the fourth semiconductor layer.

3. The light emitting diode according to claim 1, wherein the fifth semiconductor layer comprises segments spaced apart from each other and the fourth semiconductor layer has a protrusive convex shape, respectively.

4. The light emitting diode according to claim 1, wherein a thickness of the fourth semiconductor layer is thicker than a thickness of the fifth semiconductor layer.

5. The light emitting diode according to claim 1, wherein the active layer includes a well layer, a GaN based cap layer and a barrier layer and has a single quantum well structure or a multi quantum well structure.

6. A light emitting diode, comprising:
a first conductive semiconductor layer;
an active layer on the first conductive semiconductor layer;
a second conductive semiconductor layer on the active layer;
a third conductive semiconductor layer on the second conductive semiconductor layer;
a fourth semiconductor layer on the third conductive semiconductor layer; and
a fifth semiconductor layer formed on a surface of the fourth semiconductor layer,
wherein the third conductive semiconductor layer and the second conductive semiconductor layer have substantially the same width,
wherein the fourth semiconductor layer comprises portions partially protruded from the third conductive semiconductor layer and the portions are spaced apart from each other,
wherein the fourth semiconductor layer includes a dopant of an opposite polarity from a polarity of the first conductive semiconductor layer,
wherein the first conductive semiconductor layer, the third conductive semiconductor layer and the fifth semiconductor layer comprise an n-type semiconductor layer,
wherein the second conductive semiconductor layer and the fourth semiconductor layer comprise a p-type semiconductor layer.

7. The light emitting diode according to claim 6, wherein the third conductive semiconductor layer is an n-$In_xGa_{1-x}N$ based layer, wherein an indium content of the third conductive semiconductor layer is sequentially fluctuated.

8. The light emitting diode according to claim 7, wherein the n-$In_xGa_{1-x}N$ based layer has a range of $0<x<0.2$.

9. The light emitting diode according to claim 6, wherein the first conductive semiconductor layer is a GaN based layer.

10. The light emitting diode according to claim 6, further comprising an $In_xGa_{1-x}N$ based layer between the first conductive semiconductor and the active layer.

11. The light emitting diode according to claim 6, further comprising an electrode formed on the fourth semiconductor layer and the third conductive semiconductor layer,
wherein the electrode is formed of transmission metal oxide or transmission resistant metal.

12. The light emitting diode according to claim 11, wherein the transmission metal oxide is a selected one of Indium-Tin-Oxide (ITO), Zinc Oxide (ZnO), iridium oxide (IrOx), ruthenium oxide (RuOx), and nickel oxide (NiO).

13. The light emitting diode according to claim 11, wherein the transmission resistant metal is aurum (Au) alloy containing nickel (Ni).

14. A light emitting diode, comprising:
a first conductive semiconductor layer;
an active layer on the first conductive semiconductor layer;
a second conductive semiconductor layer on the active layer;
a third conductive semiconductor layer on the second conductive semiconductor layer;
a fourth semiconductor layer on the third conductive semiconductor layer; and
a fifth semiconductor layer formed on a surface of the fourth semiconductor layer,
wherein the third conductive semiconductor layer and the second conductive semiconductor layer have substantially the same width,
wherein the fourth semiconductor layer comprises portions partially protruded from the third conductive semiconductor layer and the portions are spaced apart from each other,
wherein the fourth semiconductor layer includes a dopant of an opposite polarity from a polarity of the first conductive semiconductor layer,
wherein the fifth semiconductor layer includes a super lattice structure of a InGaN based layer/InGaN based layer on the fourth semiconductor layer portions spaced apart from each other.

15. The light emitting diode according to claim 14, wherein the third conductive semiconductor layer has an opposite polarity from a polarity of the second conductive semiconductor layer.

16. The light emitting diode according to claim 14, wherein the first conductive semiconductor layer, the third conductive semiconductor layer and the fifth semiconductor layer comprise an n-type semiconductor layer,
wherein the second conductive semiconductor layer and the fourth semiconductor layer comprise a p-type semiconductor layer.

* * * * *